United States Patent [19]

Shaver

[11] Patent Number: 4,654,547
[45] Date of Patent: Mar. 31, 1987

[54] BALANCED ENHANCEMENT/DEPLETION MODE GALLIUM ARSENIDE BUFFER/COMPARATOR CIRCUIT

[75] Inventor: Michael O. Shaver, Roanoke, Va.

[73] Assignee: ITT Corporation, New York, N.Y.

[21] Appl. No.: 750,816

[22] Filed: Jun. 28, 1985

[51] Int. Cl.$^4$ .................. H03K 19/017; H03K 17/04; H03K 19/094; H03K 17/687
[52] U.S. Cl. .................................. 307/450; 307/279; 307/530
[58] Field of Search ............... 307/448, 450, 574, 581, 307/279, 530

[56] References Cited

U.S. PATENT DOCUMENTS

| | | | |
|---|---|---|---|
| 4,438,351 | 3/1984 | Schuermeyer | 307/450 |
| 4,441,039 | 4/1984 | Schuster | 307/530 X |
| 4,460,978 | 7/1984 | Jiang et al. | 307/279 X |
| 4,494,020 | 1/1985 | Konishi | 307/450 X |

FOREIGN PATENT DOCUMENTS

| | | | |
|---|---|---|---|
| 0095726 | 6/1982 | Japan | 307/451 |
| 0023923 | 2/1984 | Japan | 307/448 |
| 0061317 | 4/1984 | Japan | 307/448 |

Primary Examiner—Stanley D. Miller
Assistant Examiner—David R. Bertelson
Attorney, Agent, or Firm—John T. O'Halloran; Mary C. Werner

[57] ABSTRACT

A complementary depletion/enhancement mode (CDEM) gallium arsenide circuit utilizes switching pull-up/pull-down circuits to achieve low power consumption, and makes use of gallium arsenide field effect transistors to achieve high speed. High yield depletion mode field effect transistors are used to implement the sometimes complex complementary logic function in a pass gate configuration. Low yield enhancement mode FETs are used in the closely coupled and spaced tracking circuit. Closely spaced enhancement mode FETs are used because of the likelihood of their having closely matched thresholds.

10 Claims, 6 Drawing Figures

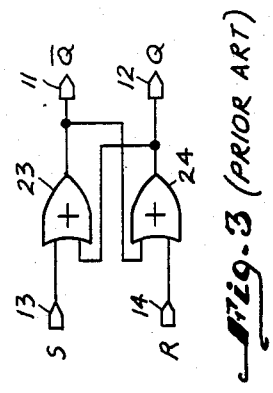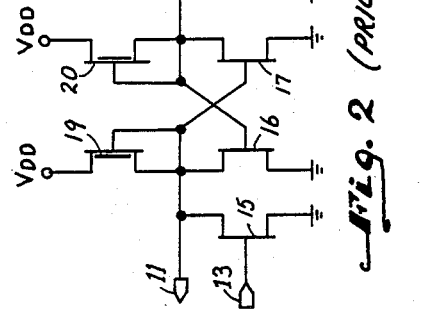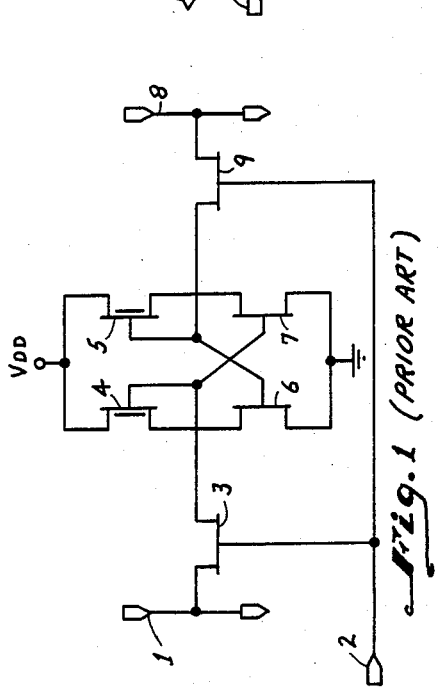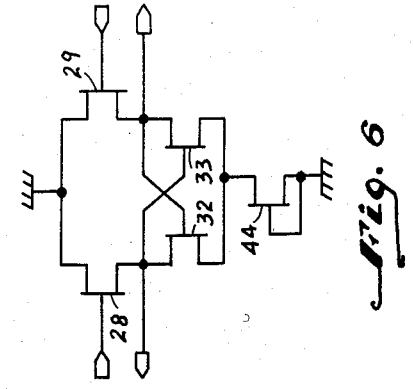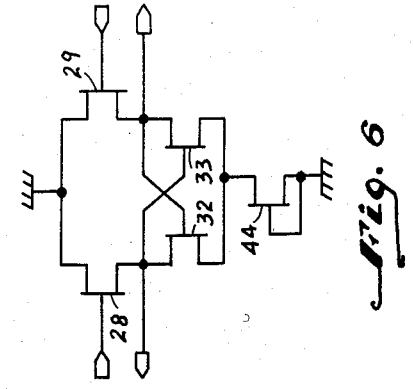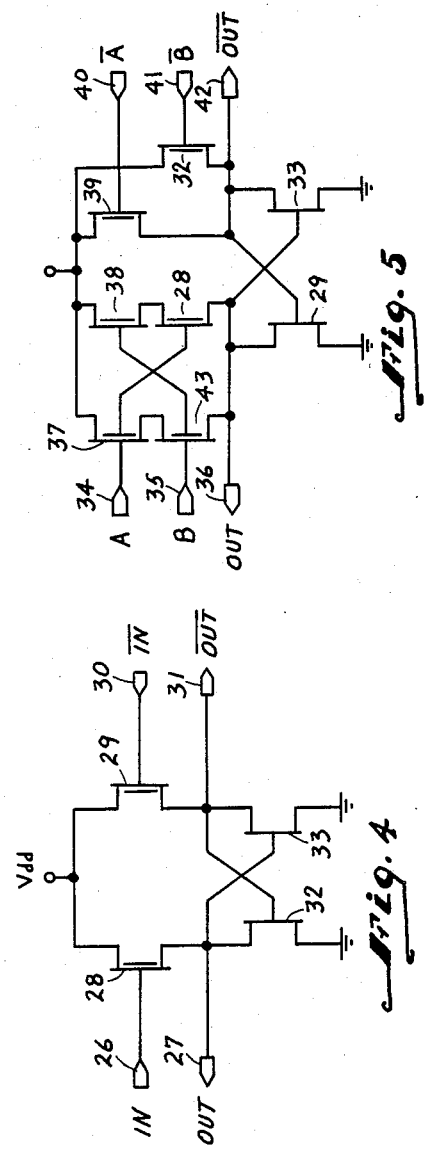

BALANCED ENHANCEMENT/DEPLETION MODE GALLIUM ARSENIDE BUFFER/COMPARATOR CIRCUIT

BACKGROUND OF THE INVENTION

The invention relates to a balanced enhancement/depletion mode buffer comparator circuit utilizing two pairs of close coupled gallium arsenide field effect transistors.

The article "A GaAs 4K Bit Static RAM with Normally-On and Off Combination Circuit", published in the IEEE Gallium Arsenide Integrated Circuit Symposuim, Technical Digest 1984, pp. 117–120, discloses a pass gated memory flip-flop shown in FIG. 1 wherein the data bus acts through the pass gates to cause the cross coupled enhancement mode FETs to switch states. The depletion mode FETs act only as constant current sources for the respective cross coupled E-Mode FETs.

Another circuit known from the prior art is shown in FIG. 2. In this circuit, additional E-Mode FETs are wired in parallel with the E-Mode FETs of FIG. 1. By pulsing the inputs of these E-Mode FETs independently, the pulsed FETs can be made to overdrive their respective outputs to ground, forcing the flip-flop to assume a new state.

The aforementioned RAM cell shown in FIG. 1 requires the data bus to overdrive its output to produce a new state for the flip-flop. The D-Mode FETs are always "on" providing a bias for the cross coupled E-Mode FETs one of which is always "on" to overdrive the bias current to achieve a low voltage output. Thus power is not used efficiently.

The aforementioned flip-flop shown in FIG. 2 utilizes a wired OR FET to overdrive the output to cause a state change, thus buffering the inputs. However the FET bias current must still be overdriven to achieve a logic low output voltage with the same power dissipation as the aforementioned RAM cell. This situation is aggravated by the higher bias currents of wired OR FETs. This circuit requires six active devices, two more than the RAM cell.

SUMMARY OF THE INVENTION

The balanced ED-Mode gallium arsenide buffer comparator circuit in the present invention utilizes two pairs of closely coupled FETs (D-Mode and E-Mode pairs). The depletion mode FETs are used to control a state of the cross coupled enhancement mode FETs' complementary tracking function. In the stable state, the D-Mode FETs is "on" while the respective E-Mode FET is "off" and, on the complementary output, the D-Mode FET is biased to "zero volts" while the respective E-Mode FET is bias to "on". Utilizing the D-Mode FET to control the circuit results in reducing the biased current which the E-Mode FETs must overdrive. Thus the current consumption is reduced.

It is another object of the circuit of the present invention to provide built-in stabilization against threshold variations of either or both FETs pairs. Both E-Mode FETs additively eliminate common mode offsets (both threshold and input signals), and additively amplify differential input signals. Common mode offsets result in a common mode voltage increase in the outputs. The cross coupled E-Mode FETs both sense this increase in voltage in the same direction and both increase their drain current thus stabilizing the output voltage. Differential voltages result in diverging current amplitudes in the E-Mode FETs, causing the output to likewise diverge. However, the circuit of the present invention utilizes close coupled SAG FETs to minimize built in differential offsets due to the processing variation of thresholds between the paired FETs. Thus, as a package, the circuit of the present invention is conducive to integrated circuit layouts which enhance stability.

It is another object of the present invention to utilize high yield D-mode FETs to implement the sometimes complex logic functions the low yield E-mode FETs are used only in the cross coupled circuit functions. Thus, the higher yield D-Mode FETs are more common in the circuit whereas in standard logic circuits the E-Mode FETs are more populous.

It is a further object of the present invention to provide a universal gate circuit comprising the AND, NAND OR, NOR, and inverter operations in a single circuit. Such a circuit is not possible using standard E-Mode (DCFL) logic. An advantage inherent in this circuit is that the hysteresis naturally found therein and the balanced signal used to interface with this circuit result in superior noise tolerances relative to those achievable in standard logic cells and circuits.

BRIEF DESCRIPTION OF THE DRAWING

FIG. 1 is a schematic of a prior art random access memory cell (flip-flop).

FIG. 2 is a schematic of an ED-Mode set reset flip-flop.

FIG. 3 is a Boolean schematic of the circuit of FIG. 2.

FIG. 4 is a schematic of the balanced ED-Mode GaAs buffer/comparator circuit of the present invention.

FIG. 5 is a schematic of the universal gate circuit of the present invention.

FIG. 6 is a schematic of the basic ED Mode GaAs comparator circuit of the invention with an added balancing FET.

DETAILED DESCRIPTION OF THE INVENTION

The prior art of FIG. 1 discloses a memory cell such as might be used in a random access memory (RAM). In this circuit field effect transistors 3 and 9, which are gated by input gate 2, such that the data bus input 1 and the negative data bus input 8 respectively function to change the state of enhancement mode FETs 7 and 6. Thus FETs 3 and 9 control the state of the flip-flop circuit. Depletion mode FETs 4 and 5, which have a common drain voltage $V_{DD}$, act only as independent loads (constant current sources) for E-Mode field effect transistors 7 and 6 respectively.

FIGS. 2 and 3 disclose the prior art E-Mode set-reset flip-flop circuit. In this circuit two pairs of E-Mode FETs (15, 16, 17 and 18) are connected such that each FET is in parallel with the other FET in its pair. The flip-flop is constructed such that Q input 12 gates FET 16, Q input 11 gates FET 17, S input 13 gates FET 15, and R input 14 gates FET 18. Depletion mode FETs 19 and 20 act as independent loads (constant current sources) with regard to the respective E-Mode FETs to which they are connected. As shown in FIG. 3, the circuit of FIG. 2 is equivalent to a pair of NOR gates which respectively operate on the set 13 and reset 14 inputs of the circuits as well as on the outputs of the other NOR gate. The Q and Q outputs for the flip-flop circuit are obtained at 12 and 11, respectively.

FIG. 4 shows the buffer/comparator circuit of the present invention. The circuit is essentially a voltage comparator, comparing the voltages 26 and 30 respectively applied to the gates of D-Mode FETs 28 and 29. These inputs cause proportional currents through the respective FETs resulting in proportional voltages induced across FETs 33 and 32. Any difference in drain voltage across the tracking FETs 33 and 32 is amplified in the cross coupled circuit. The drain voltages will closely track each other in opposite directions as the respective FETs 33 and 32 ramp to their limits.

In the circuit of FIG. 4, each FET increases drain to source current as its gate to source voltage increases. FETs 28 and 29 are a matched identical pair and, likewise, FETs 32 and 33 are a matched identical pair. In this circuit FETs 28 and 29 have a negative threshold voltage, and FETs 32 and 33 have a zero threshold; all other parameters are equivalent. For this circuit to function as intended, it is necessary for the relative threshold voltages of FETs 32 and 33 to be equal to or greater than the threshold of FETs 28 and 29; or for the common node input voltages to be higher than the output voltages. Otherwise, the circuit will have neither amplification nor hysteresis.

In FIG. 4, FETs 28 and 32 have opposite control input signals (voltages) as a consequence of the complementary input control signals (voltages) of FETs 28 and 29. In other words, the control input signal of FET 28 is high and the control input signal of FET 32 is low. The opposite is true for the totem pole circuit comprising FETs 29 and 32. The two totem pole circuits comprising FETs 28 and 32, and 29 and 33, respectively, would act as source follower circuits except for the cross coupled function of FETs 32 and 33, which result in an astable (flip-flop circuit). As the differential input signals cross each other, the astable circuit resists a change in the output until the required hysteresis is obtained; then the output state switches to an opposite polarity, reversing the sense of the hysterises loop. Because of this hysteresis, if the input signal were allowed to float (tri-state), the circuit would maintain its last output state, a fact useful in the implementation of RAM and SRFF circuits such as are shown in FIGS. 1 and 2.

Common mode input signals result in increasing the pass gate function of FETs 28 and 29 from the bias voltage to the outputs. FETs 32 and 33 sense the common increase in their cross coupled input signals resulting in a common mode increase in their pass gate function (current) to ground. This reduces the common mode output signal (voltage) required to balanced the net node current (Kirchoff's current law). The output signal subtracts from the input signal bias on FETs 28 and 29. Thus the common mode of FETs 32 and 33 additively increases the common mode rejection rate.

In the circuit of FIG. 4, a positive voltage on Input Terminal 26 causes FET 28 to conduct at a high level, resulting in a relatively low state of conduction in E mode FET 32 and a high output on output terminal 27. Meanwhile D-mode FET 29 is in a low state of conduction, FET 33 is in a high state of conduction and output 31 is low. The circuit functions such that a high voltage input on one of its D-mode FETs cause that D-mode FET to conduct at a high level, thus overpowering the current from the E-mode FET on its particular side, and causing a high level output on that side. Experiment has shown that the flip-flop circuit consumes less current during switching from one state to another.

FIG. 5 discloses an embodiment of the invention where elements are added to the circuit of FIG. 4 to create a universal gate. Thus the addition D-Mode field effect transistors, 37, 38 and 43 to the FETs 28-32 of the basic circuit results in a "AND" gate being formed. Likewise, the parallel connection of D-Mode FET 39 in parallel with FET 32 from the basic circuit of FIG. 4 results in a "OR" gate being formed. Also, there are several inverter paths in the circuit.

FIG. 6 shows a circuit similar to the circuit of FIG. 4 except with a balancing enhancement mode FET 44 connected in series with FET 32 and 33. The balancing FET results in greater amplification and thus faster switching time. The balancing FET causes competition for the common current sink by the two current paths through FETs 28 and 32 and FETs 29 and 33. This results in a current switching effect. Secondly, the balance FET isolates the gate source capacitance of the tracking FETs from ground. Experiment has shown this arrangement to be helpful in preventing transients from switching the state of the flip-flop.

Applications of the aforementioned circuits have been verified on VAX computer simulation program SPICE, and IBM Portable PC computer simulation MICROCAP. These simulations show direct uses for the circuit of FIG. 4 as a differential comparator, logic inverter, Schmitt trigger, and balanced bus receiver and driver. With external circuitry as shown in FIG. 5, the basic circuit has simulated a universal AND, NAND, OR, NOR logic gate. With other additional circuitry it has simulated a RAM cell pass gated SRFF, strobed comparator for ADCs, Analog Sample and Hold, a voltage controlled delay element, and a digital controlled delay element for subsequent utilization in Voltage and Digital controlled oscillators. Additional uses may be uncovered as research continues. Essentially, the Balanced ED-MODE GaAs Buffer/Comparator Circuit function is useful in a plethora of circuit applications.

While I have described above the principles of my invention in connection with specific apparatus, it is to be clearly understood that this description is made only by way of example and not as a limitation to the scope of my invention as set forth in the objects thereof and in the accompanying claims.

I claim:

1. A balanced enhancement/depletion mode buffer/comparator circuit comprising:
   a plurality of means for pass gating a signal, each of said means for pass gating having at least a gate electrode;
   means for conducting an input signal to a gate electrode of a first of said plurality of means for pass gating;
   means for conducting a complement of said input signal to a gate electrode of a second of said plurality of means for pass gating;
   means for interconnecting a third of said plurality of means for pass gating in series with said first of said means for pass gating;
   means for inter-connecting a fourth of said plurality of means for pass gating in series with said second of said means for pass gating;
   means for obtaining a first output signal from the serial interconnection of said first and third of said plurality of means for pass gating and for connecting a gate electrode of said fourth of said plurality of means for pass gating thereto;

means for obtaining a second output signal from the serial interconnection of said second and fourth of said plurality of means for pass gating and for connecting a gate electrode of said third of said plurality of means for pass gating thereto, said first and second output signals being complementary; and means for applying a common bias to said first and second of said plurality of means for pass gating, said first and second of said plurality of means for pass gating exhibiting an increased pass gate function resulting from common mode input signals and said third and fourth of said plurality of said means for pass gating being responsive thereto to exhibit a common mode increase in pass gate function.

2. The balanced enhancement/depletion mode buffer/comparator circuit according to claim 1 wherein said first and second of said plurality of means for pass gating comprise depletion mode field effect transistors.

3. The balanced enhancement/depletion mode buffer/comparator circuit according to claim 1 wherein said first and second of said plurality of means for pass gating comprise a matched pair of depletion mode field effect transistors having corresponding characteristics.

4. The balanced enhancement/depletion mode buffer/comparator circuit according to claim 1 wherein said third and fourth of said plurality of means for pass gating comprise ehancement mode field effect transistors.

5. The balanced enhancement/depletion mode buffer/comparator circuit according to claim 1 wherein said third and fourth of said plurality of means for pass gating comprise a matched pair of enhancement mode field effect transistors having corresponding characteristics.

6. The balanced enhancement/depletion mode buffer/comparator circuit according to claim 2 wherein said third and fourth of said plurality of means for pass gating comprise enhancement mode field effect transistors.

7. The balanced enahancement/depletion mode buffer/comparator circuit according to claim 1 additionally comprising a fifth depletion mode field effect transistor connected in parallel with said second of said plurality of means for pass gating, said fifth depletion mode field effect transistor having a gate electrode and means for applying a complement of another input signal to said gate electrode of said fifth depletion mode field effect transistor.

8. The balanced enhancement/depletion mode buffer/comparator circuit according to claim 6 additionally comprising input logic gate means, said input logic gate means including:

a fifth depletion mode field effect transistor connected in series with said first of said plurality of means for pass gating, said fifth depletion mode field effect transisitor having drain, source and gate electrode and said source and drain electrodes being connected respectively to said first of said plurality of means for pass gating and said means for applying a common bias;

a sixth depletion mode field effect transistor having drain, source and gate electrodes, said drain electrode of said sixth depletion mode field effect transistor being connected to said means for applying a common bias and said gate electrodes of said sixth depletion mode field effect transistor being connected to said means for conducting an input signal and to a gate electrode of said first of said plurality of means for pass gating;

a seventh depletion mode field effect transistor having drain, source and gate electrodes, said drain and source electrodes of said seventh depletion mode field effect transistor being connected to said source electrode of said sixth depletion mode field effect transistor and said means for obtaining a first output respectively, and said gate electrode of said seventh depletion mode field effect transistor being connected to said gate electrode of said sixth depletion mode field effect transistor; and means for conducting another input signal to said gate electrode of said seventh depletion mode field effect transistor.

9. The balanced enhancement/depletion mode buffer/comparator circuit according to claim 8 additionally comprising a eighth depletion mode field effect transistor connected in parallel with said second of said plurality of means for pass gating, said eighth depletion mode field effect transistor having a gate electrode and means for applying a complement of said another input signal to said gate electrode of said eighth depletion mode field effect transistor.

10. The balanced enhancement/depletion mode buffer/comparator circuit according to claim 6 additionally comprising a balancing enhancement mode field effect transistor having drain, source and gate electrodes, said drain electrode of said balancing enhancement mode field effect transistor being connected to said third and fourth of said plurality of means for pass gating and said source and gate electrodes of said balancing enhancement mode field effect transistor being connected to reference potential.

* * * * *